(12) United States Patent
Kunze et al.

(10) Patent No.: US 11,187,723 B2
(45) Date of Patent: Nov. 30, 2021

(54) DIFFERENTIAL TEST PROBE

(71) Applicant: Rohde & Schwarz GmbH & Co. KG, Munich (DE)

(72) Inventors: Alexander Kunze, Munich (DE); Stefan Ketzer, Geiersthal (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 15/339,730

(22) Filed: Oct. 31, 2016

(65) Prior Publication Data

US 2018/0120350 A1 May 3, 2018

(51) Int. Cl.
*G01R 1/067* (2006.01)
*G01R 1/073* (2006.01)

(52) U.S. Cl.
CPC ..... *G01R 1/06772* (2013.01); *G01R 1/06722* (2013.01); *G01R 1/07364* (2013.01)

(58) Field of Classification Search
CPC ............ G01R 1/07364; G01R 1/06722; G01R 1/06772; G01R 1/06788; G01R 1/07342
See application file for complete search history.

(56) References Cited

U.S. PATENT DOCUMENTS

| 4,721,903 | A | * | 1/1988 | Harsch | ............... | G01R 1/06788 |
| | | | | | | 30/367 |
| 5,789,911 | A | * | 8/1998 | Brass | .................... | G01R 19/14 |
| | | | | | | 324/133 |
| 6,000,282 | A | * | 12/1999 | Ku | ........................... | G01B 5/28 |
| | | | | | | 73/105 |
| 6,404,215 | B1 | * | 6/2002 | Nightingale | ....... | G01R 1/07364 |
| | | | | | | 324/72.5 |
| 6,459,287 | B1 | * | 10/2002 | Nightingale | ....... | G01R 1/06705 |
| | | | | | | 324/72.5 |
| 6,856,126 | B2 | * | 2/2005 | McTigue | ........... | G01R 1/06766 |
| | | | | | | 324/149 |
| 7,317,312 | B1 | * | 1/2008 | Tsai | ..................... | G01R 1/0416 |
| | | | | | | 324/754.11 |
| 7,408,363 | B2 | * | 8/2008 | Tan | ...................... | G01R 35/005 |
| | | | | | | 324/601 |
| 9,404,940 | B1 | * | 8/2016 | Campbell | .......... | G01R 1/06788 |

(Continued)

FOREIGN PATENT DOCUMENTS

| EP | 1780551 A1 | 5/2007 |
| WO | WO2013124002 A1 | 8/2013 |

*Primary Examiner* — Son T Le
*Assistant Examiner* — Dustin R Dickinson
(74) *Attorney, Agent, or Firm* — Potomac Technology Law, LLC (57) ABSTRACT

A high bandwidth differential test probe for measuring a device under test is provided. The test probe comprises a first probe tip arranged at a first coaxial connector relative to a first rotational axis, and a second probe tip arranged at a second coaxial connector relative to a second rotational axis. For adjusting the distance between the first probe tip and the second probe tip, the first coaxial connector is rotatable with respect to the first rotational axis and the second coaxial connector is rotatable with respect to the second rotational axis. Additionally, a tilt angle between the first probe tip and a plane comprising both the first and second rotational axes, and a tilt angle between the second probe tip and the plane, is not equal to zero.

12 Claims, 4 Drawing Sheets

(56) References Cited

U.S. PATENT DOCUMENTS

| | | | |
|---|---|---|---|
| 2003/0193341 A1* | 10/2003 | McTigue | G01R 1/06766 324/755.05 |
| 2004/0043653 A1* | 3/2004 | Feldman | G01R 1/06772 439/219 |
| 2005/0262953 A1* | 12/2005 | Pooley | G01D 11/245 73/866.5 |
| 2006/0267604 A1* | 11/2006 | Yang | G01R 1/06788 324/754.07 |
| 2006/0267606 A1* | 11/2006 | Groshong | G01R 1/06772 324/754.07 |
| 2006/0291054 A1 | 12/2006 | Tomoguchi | |
| 2009/0072846 A1* | 3/2009 | Fjerstad | G01R 35/005 324/757.02 |
| 2009/0167332 A1* | 7/2009 | Forbes | G01R 1/06772 324/755.02 |
| 2014/0139205 A1* | 5/2014 | Peschke | G01R 1/30 324/123 R |
| 2015/0369841 A1 | 12/2015 | Kunze et al. | |
| 2016/0216320 A1 | 7/2016 | McTigue | |
| 2016/0291054 A1 | 10/2016 | Hagerup et al. | |
| 2017/0052216 A1* | 2/2017 | Campbell | G01R 1/06705 |
| 2017/0067940 A1* | 3/2017 | Chen | G01R 15/183 |
| 2017/0122982 A1* | 5/2017 | Gabrys | G01R 1/07342 |
| 2017/0271828 A1* | 9/2017 | Mende | H01R 24/542 |

* cited by examiner

DIFFERENTIAL TEST PROBE

FIELD

The present invention relates to a differential test probe, such as a high bandwidth differential test probe for probing a device under test.

BACKGROUND

In current times, there is an increasing number of devices that include radio frequency components, where such components provide a differential signal having a very high bandwidth and are generally difficult to access for testing. Accordingly, there is a growing need for high bandwidth differential test probes that facilitate ease in performing measurements and achieve high accuracy in such measurements, even where respective test points are difficult to access.

The publication WO 2013/124002 A1 discloses an adapter for a differential signal measuring scanning head, consisting of two electrically conductive measuring contact elements, each configured for the detection of a partial signal of a differential signal, and each arranged concentrically relative to an axis of rotation. Additionally, two setting parts are provided in the adapter, each of which being rotatable about one of the two axes of rotation for setting a variable distance between the two measuring contact elements, respectively between the probe tips. However, a longitudinal axis of each probe tip is parallel to the two axes of rotation, which requires the user to hold the test probe in a manner to make contact between the probe tips and the measuring points. Consequently, due to the required hand-held position, the probe tips tend to easily slip off from the measuring points, which results in measuring errors or even in a damage to the device under test, for example, resulting from a short circuit accidentally caused by the probe tips.

What is needed, therefore, is a differential test probe configured to achieve measurement of high frequency or high bandwidth differential signals, and to prevent the probe tips from slipping off the respective test points to ensure accurate measurements without errors.

SOME EXAMPLE EMBODIMENTS

Embodiments of the present invention advantageously address the foregoing requirements and needs, as well as others, by providing a differential test probe configured to achieve measurement of high frequency or high bandwidth differential signals, and to prevent the probe tips from slipping off the respective test points to ensure accurate measurements without errors.

In accordance with example embodiments of the present invention, a differential test probe for probing a device under test is provided. The differential test probe comprises a first probe tip and a second probe tip. The first probe tip is arranged on the test probe relative to a first rotational axis, and the second probe tip is arranged on the test probe with relative to a second rotational axis. Further, a first tilt angle between the first probe tip and a plane comprising both the first rotational axis and the second rotational axis is not equal to zero. Further, a second tilt angle between the second probe tip and the plane is not equal to zero. Advantageously, due to the first and the second tilt angle, respectively due to their synergistic combination, the test probe is configured in an ergonomic manner that facilitates a more relaxed hand-held positioning of the test probe relative to the test points, which beneficially helps prevent the probe tips from slipping off the test points.

According to a further embodiment, the second tilt angle is equal to the first tilt angle. Advantageously, due to the equality of the first and the second tilt angle, the above-mentioned ergonomic usage is further improved.

According to a further embodiment, the differential test probe further comprises a first pin body and a second pin body. Further, a first discrete resistor is mounted between the first probe tip and the first pin body, and a second discrete resistor is mounted between the second probe tip and the second pin body. Advantageously, each of the first and the second discrete resistor is responsible for adaption between the respective measuring point and the measurement scope. By way of example, a first resistance value of the first discrete resistor is between 300 and 370 ohm, and a second resistance value of the second discrete resistor is between 300 and 370 ohm. By way of further example, the first resistance value of the first discrete resistor is 332 ohm, and the second resistance value of the second discrete resistor is 332 ohm. Advantageously, in the case that each of said first and second resistance value is equal to 332 ohm, this beneficially allows for measurements at frequencies greater than 6 GHz.

According to a further embodiment, the differential test probe further comprises a first probe sleeve and a second probe sleeve. The first probe sleeve is arranged to support the first pin body in a longitudinally slidable manner, and the second probe sleeve is arranged to support the second pin body in a longitudinally slidable manner.

According to a further embodiment, the differential test probe further comprises a first spring member and a second spring member. The first spring member is arranged between the first probe sleeve and the first pin body, and the second spring member is arranged between the second probe sleeve and the second pin body. Beneficially, with the aid of each spring member, respectively with the aid of the synergistic combination thereof, with respect to the device under test, both differences in height and tolerances are advantageously compensated, which further helps prevent the probe tips from slipping off the test points, and thereby further facilitates accurate measurements without errors caused by flatness imperfections of the device under test.

According to a further embodiment, the first probe sleeve comprises a first distributed capacitor, and the second probe sleeve comprises a second distributed capacitor. Advantageously, with the aid of said distributed capacitors, a parasitic inductance of the inventive test probe is compensated.

According to a further embodiment, the differential test probe further comprises a first coaxial connector and a second coaxial connector. Further, the first coaxial connector is rotatable with respect to the first rotational axis for adjusting the distance between the first and the second probe tip, and the second coaxial connector is rotatable with respect to the second rotational axis. Advantageously, this allows for ergonomic positioning of the test probe with respect to variously spaced measuring or test points. By way of example, the first coaxial connector and the second coaxial connector may be connected to each other in a force-fitting manner. Advantageously, the probe tips of the inventive test probe are simultaneously moved in a symmetrical manner, which beneficially further improves the above-mentioned ergonomic usage.

According to a further embodiment, the first coaxial connector is rotationally symmetric with respect to the first rotational axis, and the second coaxial connector is rotationally symmetric with respect to the second rotational axis.

Accordingly, due to the rotational symmetry of each of the first and the second coaxial connector, the wave impedance of the differential test probe is beneficially independent of the distance setting regarding the first and the second probe tip because of a constancy of the geometric relationships. In other words, the transfer function of the test probe is independent of both the position of each of the two probe tips and the position of the two probe tips with respect to each other, such as regarding the spacing of the probe tips.

According to a further embodiment, the first coaxial connector comprises a first radio frequency adaptor, and the second coaxial connector comprises a second radio frequency adaptor.

According to a further embodiment, each of the first and the second radio frequency adaptor is replaceable. Advantageously, due to said replaceability of each of the first and the second radio frequency adaptor, in the case of damage or attrition, the inventive differential test probe can be repaired in a most cost-efficient manner.

According to a further embodiment, each of the first and the second radio frequency adaptor is partially or completely surrounded by an isolator. By way of example, the isolator may be made from Teflon.

According to a further embodiment, the first probe tip and the first pin body are partially covered by a first isolating cap, and the second probe tip and the second pin body are partially covered by a second isolating cap. Advantageously, due to the presence of the first and the second isolating cap, an accidental short circuit of the device under test during measurement is avoided.

According to a further embodiment, the differential test probe further comprises at least one seal ring. The at least one seal ring is configured to avoid an unintentional change of the distance between the first and the second probe tip with the aid of a heightened contact pressure caused by the at least one seal ring. Advantageously, due to the at least one seal ring and the avoidance of an unintentional change of the distance between the two probe tips, a slipping off from the measuring point is prevented.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

Approaches for a differential test probe configured to achieve measurement of high frequency or high bandwidth differential signals, and to prevent the probe tips from slipping off the respective test points to ensure accurate measurements without errors, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

As will be appreciated, a module or component (as referred to herein) may be composed of software component(s), which are stored in a memory or other computer-readable storage medium, and executed by one or more processors or CPUs of the respective devices. As will also be appreciated, however, a module may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention.

Figure 1:
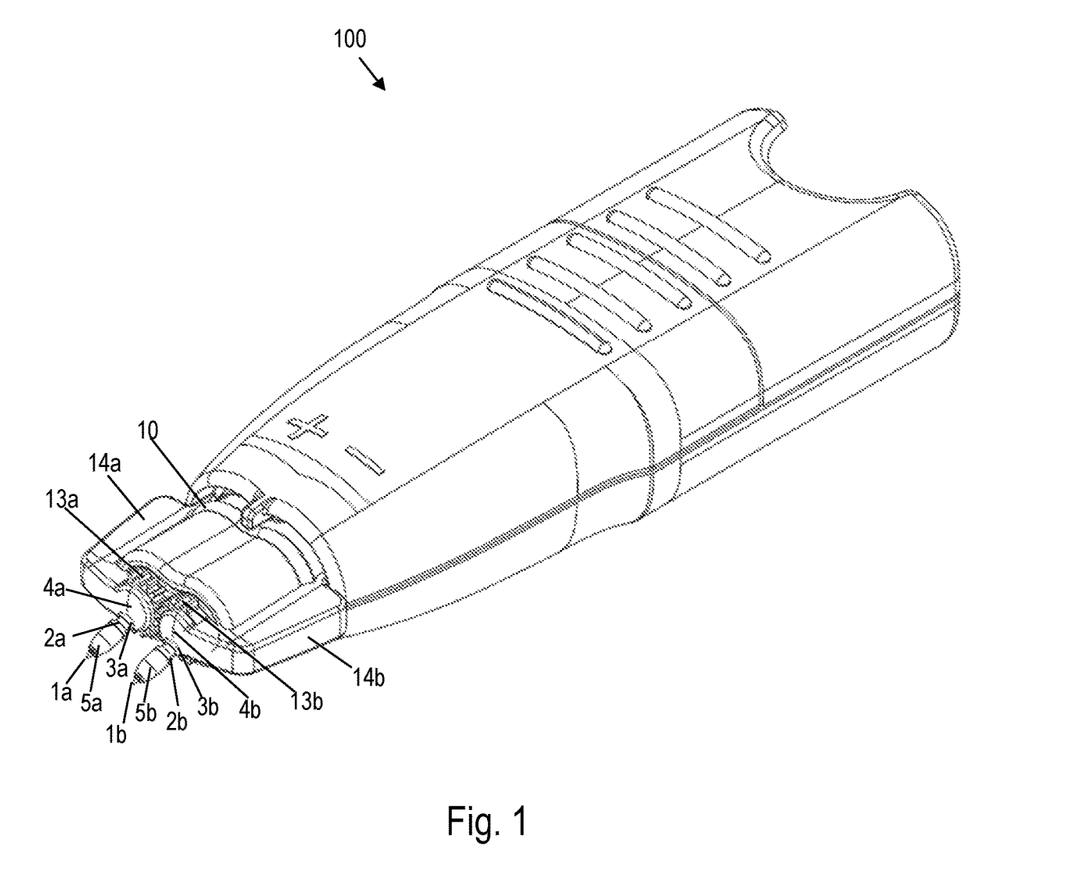
FIG. 1 shows a three-dimensional view of a high frequency differential test probe, in accordance with example embodiments.

FIG. 1 shows a three-dimensional view of a high frequency differential test probe 100, in accordance with example embodiments of the present invention.

The differential test probe 100 comprises a first probe tip 1a and a second probe tip 1b, and a first pin body 2a and a second pin body 2b. According to one embodiment a first discrete resistor is arranged between the first probe tip 1a and the first pin body 2a, and a second discrete resistor is arranged between the second probe tip 1b and the second pin body 2b. By way of example, the first and second discrete resistors are SMD resistors. In FIG. 1, the first and second discrete resistors cannot be seen as they are at least partially covered a first isolating cap 5a and a second isolating cap 5b, respectively.

By way of example, according to different embodiments, the resistance value of the second discrete resistor may be configured generally between 300 and 370 ohm, or more narrowly between 310 and 360 ohm, or more narrowly between 320 and 350 ohm, or most narrowly between 330 and 340 ohm. Analogously, according to different embodiments, the resistance value of the first discrete resistor may be configured generally between 300 and 370 ohm, or more narrowly between 310 and 360 ohm, or more narrowly between 320 and 350 ohm, or most narrowly between 330 and 340 ohm. Further, according to one embodiment the resistance values of the first and second discrete resistors is configured as being equal to 332 ohm. In this manner, an ideal adaption between the measuring point and the scope is achieved, which allows for measurements at frequencies greater than 6 GHz.

According to a further embodiment, the differential test probe 100 comprises a first probe sleeve 3a arranged or configured to support the first pin body 2a in a longitudinally slidable manner. Analogously, the test probe 100 comprises a second probe sleeve 3b arranged or configured to support the second pin body 2b in a longitudinally slidable manner.

According to a further embodiment, a first spring member is arranged between the first probe sleeve 3a and the first pin body 2a, and a second spring member is arranged between the second probe sleeve 3b and the second pin body 2b. The first and second spring members cannot be seen in FIG. 1 as they are mounted internally. Accordingly, with the aid of each of the spring members, respectively with the aid of the synergistic combination thereof, both differences in height and tolerances between the probe tips relative to the device under test can be compensated for, which helps prevent the probe tips from slipping off the test points of the device under test, and thereby further facilitates accurate measurements without errors caused by flatness imperfections of the device under test.

According to a further embodiment, the first probe tip 1a, respectively the first probe sleeve 3a, is arranged with respect to a first rotational axis of a first coaxial connector 4a. Analogously, the second probe tip 1b, respectively the second probe sleeve 3b, is arranged with respect to a second rotational axis of a second coaxial connector 4b. Accordingly, for adjusting the distance between the first probe tip 1a and the second probe tip 1b, the first coaxial connector 4a is rotatable with respect to the first rotational axis of the first coaxial connector 4a, and the second coaxial connector 4b is rotatable with respect to said second rational axis. Further, with the aid of interlocking teeth 13a, 13b, the first coaxial connector 4a and the second coaxial connector 4b are advantageously connected to each other in a force-fitting manner. Thereby, advantageously, for comfortably adjusting the distance between the first probe tip 1a and the second probe tip 1b, a first adjusting portion 14a is attached to the first coaxial connector 4a, and a second adjusting portion 14b is attached to the second coaxial connector 4b. Further advantageously, the differential test probe 100 comprises a seal ring 10 which is embodied to avoid an unintentional change of the distance between the first probe tip 1a and the second probe tip 1b with the aid of a heightened contact pressure caused by the seal ring 10 and applied to the first adjusting portion 14a and to the second adjusting portion 14b.

According to such embodiments, a first tilt angle between the first probe tip 1a and a plane comprising both the first rational axis of the first coaxial connector 4a and the second rotational axis of the second coaxial connector 4b is configured as not being equal to zero. In other words, a first longitudinal axis of the first probe tip 1a is not parallel to the first rotational axis of the first coaxial connector 4a. In an analogous manner, a second tilt angle between the second probe tip 1b and the above-mentioned plane comprising both the first rational axis of the first coaxial connector 4a and the second rotational axis of the second coaxial connector 4b is configured as not being equal to zero. In other words, a second longitudinal axis of the second probe tip 1b is not parallel to the second rotational axis of the second coaxial connector 4b. By way of example, the first tilt angle may be configured as being equal to the second tilt angle. Alternatively, with respect to the case of flatness imperfections of the device under test, the first tilt angle may be configured as not being equal to the second tilt angle.

Advantageously, due to the first and the second tilt angle, respectively due to their synergistic combination, the test probe is configured in an ergonomic manner that facilitates a more relaxed hand-held positioning of the test probe relative to the test points, which beneficially helps prevent the probe tips from slipping off the test points. In other words, with the aid of the first and the second tilt angle, respectively with the aid of their synergistic combination, an ergonomic usage of the inventive test probe 100 is achieved, which advantageously leads to an avoidance of slipping off from the test point by avoiding a tensed hand position of the user.

Figure 2:
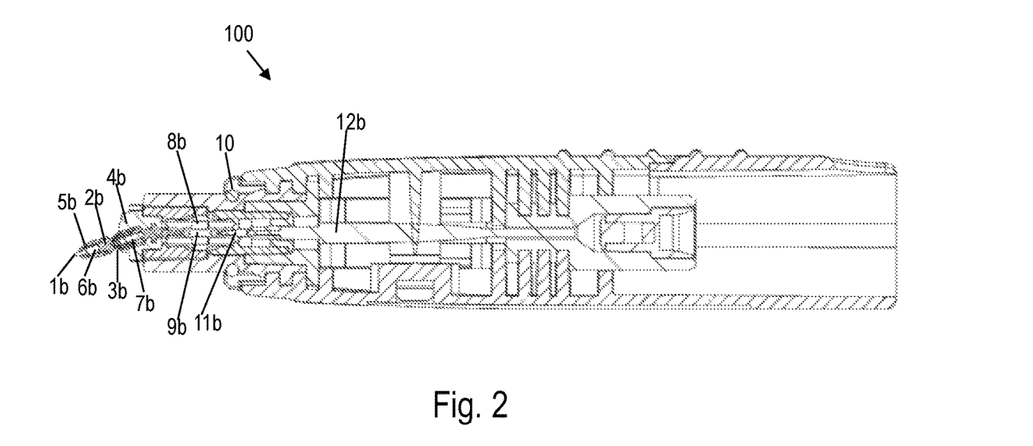
FIG. 2 shows a lateral view of a cross section of a high frequency differential test probe, in accordance with example embodiments.

FIG. 2 shows a lateral view of a cross section of a high frequency differential test probe 100, in accordance with example embodiments of the present invention. Consequently, some inlying parts such as the first discrete resistor, respectively in this case, the second discrete resistor 6b, and the first spring member, respectively the second spring member 7b, can now be seen.

Figure 3:
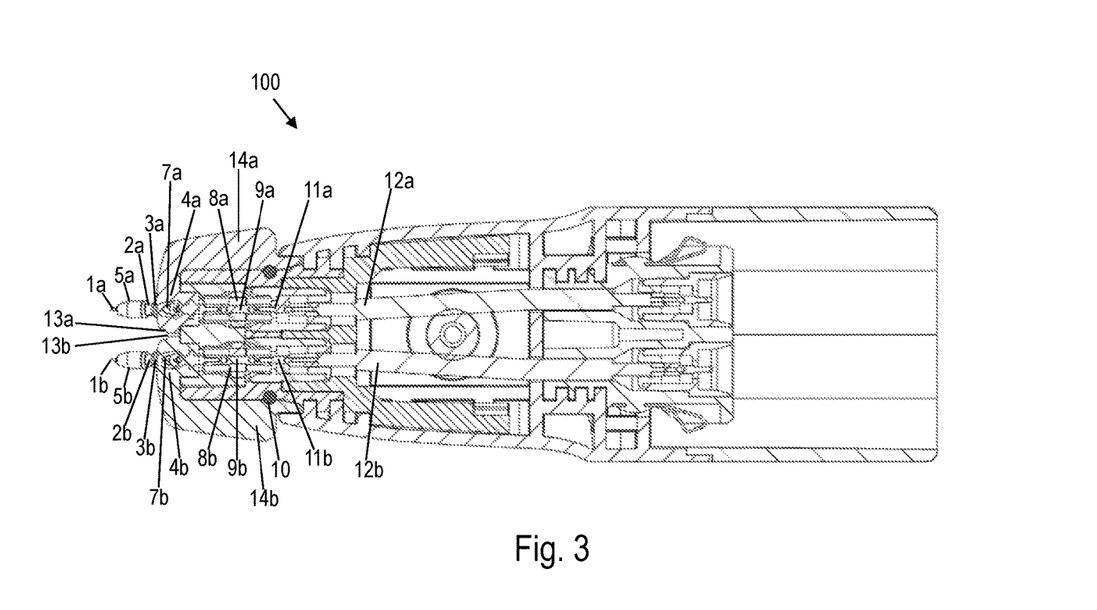
FIG. 3 shows a top view of a cross section of a high frequency differential test probe, in accordance with example embodiments.

FIG. 3 shows a top view of a cross section of a high frequency differential test probe 100, in accordance with example embodiments of the present invention.

With reference to FIG. 2, the second coaxial connector 4b is rotationally symmetric with respect to the second rotational axis of the second coaxial connector 4b, which analogously applies to the first coaxial connector 4a which is rotationally symmetric with respect to the first rotational axis. Further, by way of example, the first coaxial connector 4a and the second coaxial connector 4b are made from a material, the permittivity of which is predefined. Accordingly, due at least in part to the rotational symmetry, the wave impedance of the differential test probe 100 is advantageously independent of the distance setting regarding the first and the second probe tips 1a, 1b, because of a constancy of the geometric relationships. In other words, the transfer function of the test probe 100 is independent of both the position of each of the two probe tips 1a, 1b, and the position of the two probe tips 1a, 1b with respect to each other, such as regarding the spacing of the probe tips 1a, 1b.

With further reference to FIG. 2, the second coaxial connector 4b comprises a second radio frequency adaptor 9b, which is partially surrounded by a second isolator 8b. In an analogous manner, the first coaxial connector 4a comprises a first radio frequency adaptor 9a (see FIG. 3), which is partially surrounded by a first isolator 8a (see FIG. 3). By way of example, the first and second isolators 8a, 8b may be made from Teflon. By way of further example, each of the first radio frequency adaptor 9a and the second radio frequency adaptor 9b is replaceable in order to ensure that, in the case of damage or attrition, the differential test probe 100 can advantageously be repaired in a most cost-efficient manner.

According to a further embodiment, the test probe 100 further comprises a second socket 11b (e.g., a sub-miniature push-on (SMP) socket or connector) for mounting a second coaxial cable 12b. With the aid of the second radio frequency adaptor 9b, the second socket 11b is connected to the second probe sleeve 3b to ensure a continuous electrical connection between the second probe tip 1b and the second coaxial cable 12b. Analogously, the test probe 100 further comprises a first socket 11a (see FIG. 3) (e.g., also an SMP socket or connector) for mounting a first coaxial cable 12a (See FIG. 3). With the aid of the first radio frequency adaptor 9a, said first socket 11a is connected to the first probe sleeve 3a to ensure a continuous electrical connection between the first probe tip 1a and the first coaxial cable 12a.

In this context, the second probe tip 1b, the second discrete resistor 6b, the second pin body 2b, the second isolating cap 5b, a portion of the second probe sleeve 3b, typically the portion outside of the second coaxial connector 4b, and a portion of the second spring member 7b, likewise typically the portion outside of the second coaxial connector 4b, are part of a second non-coaxial system, whereas the remaining components are part of a second coaxial system. In an analogous manner, the first probe tip 1a, the first discrete resistor, the first pin body 2a, the first isolating cap 5a, a portion of the first probe sleeve 3a, typically the portion outside of the first coaxial connector 4a, and a portion of the first spring member 7a, likewise typically the portion outside of the first coaxial connector 4a, are part of a first non-coaxial system, whereas the remaining components are part of a first coaxial system. By way of example, to avoid interference coupling, and thus to ensure highly accurate measurements, each of the first non-coaxial system and the second coaxial system is implemented in a relatively short manner.

Figure 4:
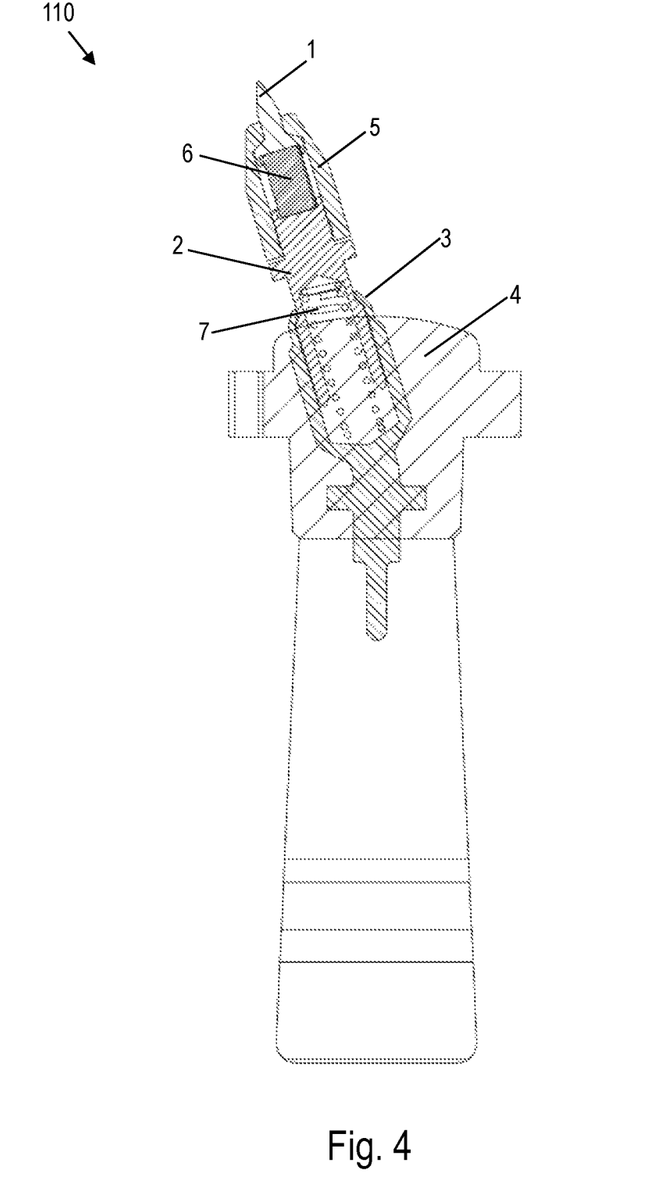
FIG. 4 shows a lateral view of a cross section of a front portion of a high frequency differential test probe, where the front portion extends to the coaxial connector, in accordance with example embodiments.

FIG. 4 shows a lateral view of a cross section of a front portion 110 of a high frequency differential test probe, where the front portion extends to the coaxial connector, in accordance with example embodiments of the present invention. The front portion 110 comprises a probe tip 1 which is connected via a discrete resistor 6 to a pin body 2 supported by a probe sleeve 3 in a longitudinally slidable manner, wherein a spring member 7 is arranged between the probe sleeve 3 and the pin body 2. The arrangement of the probe tip 1, the discrete resistor 6, and the pin body 2 is partially covered by an isolating cap 5. Additionally, the probe tip 1 is arranged with respect to the rotational axis of the rotationally symmetric coaxial connector 4 penetrated by the probe sleeve 3 at a tilt angle with respect to said rotational axis of the coaxial connector 4, wherein said tilt angle is not equal to zero.

Figure 5:
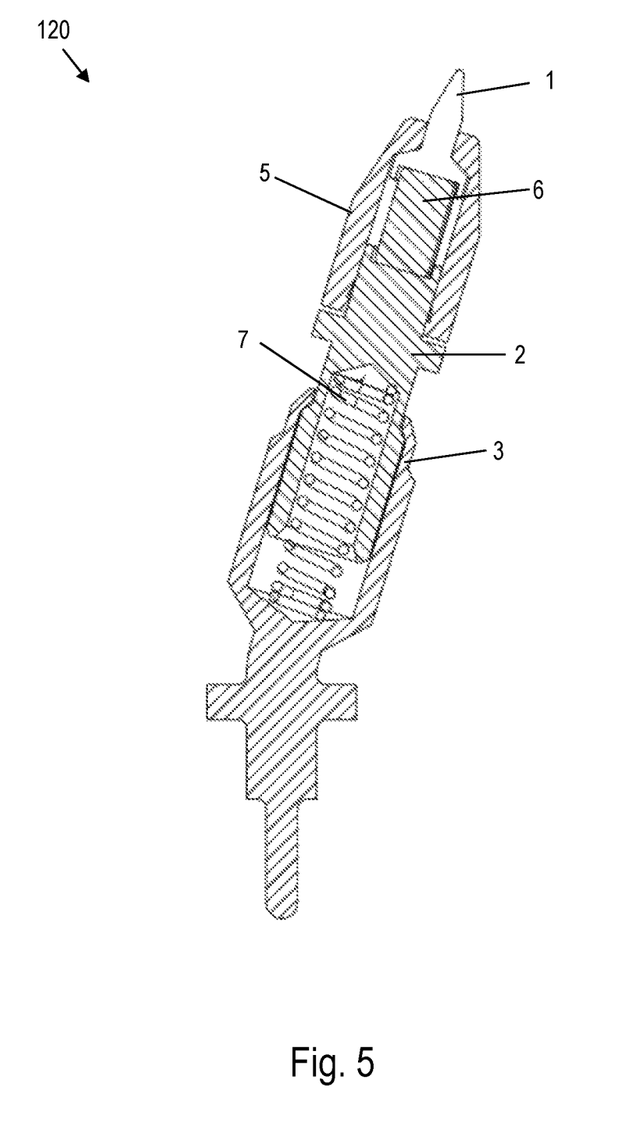
FIG. 5 shows a lateral view of a cross section of a front portion of a high frequency differential test probe, where the front portion extends to the probe sleeve, in accordance with example embodiments.

FIG. 5 shows a lateral view of a cross section of a front portion 120 of a high frequency differential test probe, where the front portion extends to the probe sleeve, in accordance with example embodiments of the present invention. The foregoing explanations regarding FIG. 4 analogously apply with the difference that FIG. 5 does not show the coaxial connector.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A differential test probe for probing a device under test, the test probe comprising:
    a first probe tip arranged with respect to a first rotational axis relative to the test probe;
    a second probe tip arranged with respect to a second rotational axis relative to the test probe;
    a first pin body and a second pin body;
    a first probe sleeve arranged to support the first pin body in a longitudinally slidable manner;
    a second probe sleeve arranged to support the second pin body in a longitudinally slidable manner;
    a first spring member arranged between the first probe sleeve and the first pin body;
    a second spring member arranged between the second probe sleeve and the second pin body; and
    a first coaxial connector and a second coaxial connector; and
    wherein the first coaxial connector comprises a first radio frequency adaptor, and the second coaxial connector comprises a second radio frequency adaptor,
    wherein a first tilt angle between the first probe tip and a plane comprising both the first rotational axis and the second rotational axis is not equal to zero,
    wherein a second tilt angle between the second probe tip and the plane is not equal to zero,
    wherein the first tilt angle is configured as not being equal to the second tilt angle,
    wherein the first probe tip and the second probe tip are configured to only be moved simultaneously,
    wherein each of the first and second radio frequency adaptors is configured to be replaceable, and
    wherein differences in height and tolerances between the probe tips relative to the device under test are compensated for with the aid of the first and second spring members.

2. The test probe according to claim 1, wherein the test probe further comprises:
    a first discrete resistor arranged between the first probe tip and the first pin body; and
    a second discrete resistor arranged between the second probe tip and the second pin body.

3. The test probe according to claim 2, wherein a first resistance value of the first discrete resistor is between approximately 300 and 370 ohm, and a second resistance value of the second discrete resistor is between approximately 300 and 370 ohm.

4. The test probe according to claim 2, wherein a first resistance value of the first discrete resistor is 332 ohm, and a second resistance value of the second discrete resistor is 332 ohm.

5. The test probe according to claim 1, wherein the first probe sleeve comprises a first distributed capacitor, and the second probe sleeve comprises a second distributed capacitor.

6. The test probe according to claim 1, wherein, for adjustment of a distance between the first and second probe tips, the first coaxial connector is rotatable with respect to the first rotational axis, and the second coaxial connector is rotatable with respect to the second rotational axis.

7. The test probe according to claim 6, wherein the first coaxial connector and the second coaxial connector are connected to each other in a force-fitting manner.

8. The test probe according to claim 6, wherein the first coaxial connector is rotationally symmetric with respect to the first rotational axis, and the second coaxial connector is rotationally symmetric with respect to the second rotational axis.

9. The test probe according to claim 6, wherein the test probe further comprises:
   at least one seal ring configured to prevent an unintentional change of the distance between the first and second probe tips.

10. The test probe according to claim 1, wherein each of the first and the second radio frequency adaptors is at least partially surrounded by an isolator.

11. The test probe according to claim 10, wherein the isolator is made from Teflon.

12. The test probe according to claim 1, wherein the first probe tip and the first pin body are at least partially covered by a first isolating cap, and the second probe tip and the second pin body are at least partially covered by a second isolating cap.

* * * * *